United States Patent
Liu et al.

(10) Patent No.: US 8,846,464 B1
(45) Date of Patent: Sep. 30, 2014

(54) SEMICONDUCTOR DEVICE HAVING CONTROLLED FINAL METAL CRITICAL DIMENSION

(71) Applicant: GLOBALFOUNDRIES Inc., Grand Cayman, KY (US)

(72) Inventors: Bingwu Liu, Malta, NY (US); Baofu Zhu, Clifton Park, NY (US); Nam Sung Kim, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/799,814

(22) Filed: Mar. 13, 2013

(51) Int. Cl.
*H01L 21/338* (2006.01)
*H01L 29/66* (2006.01)

(52) U.S. Cl.
CPC ............................ *H01L 29/66545* (2013.01)
USPC .... 438/183; 438/181; 438/197; 257/E21.006; 257/E21.042; 257/E21.043; 257/E21.051; 257/E21.092; 257/E21.127; 257/E21.267; 257/E21.278; 257/E21.293; 257/E21.421

(58) Field of Classification Search
USPC ......... 438/183, 181, 182, 184, 926, 752, 753, 438/756, 757, 683, 742; 257/E21.006, 257/E21.042, E21.043, E21.051, E21.092, 257/E21.127, E21.267, E21.278, E21.421, 257/E21.293
See application file for complete search history.

(56) References Cited

U.S. PATENT DOCUMENTS

| | | | | |
|---|---|---|---|---|
| 6,200,866 B1 * | 3/2001 | Ma et al. | | 438/299 |
| 6,622,059 B1 * | 9/2003 | Toprac et al. | | 700/121 |
| 6,716,691 B1 * | 4/2004 | Evans et al. | | 438/218 |
| 8,592,277 B2 * | 11/2013 | Sreekantham et al. | | 438/270 |
| 8,664,060 B2 * | 3/2014 | Liu et al. | | 438/229 |

* cited by examiner

*Primary Examiner* — David Nhu
(74) *Attorney, Agent, or Firm* — Darrell L. Pogue; Keohane & D'Alessandro, PLLC

(57) ABSTRACT

An approach for controlling a critical dimension (CD) of a RMG of a semiconductor device is provided. Specifically, embodiments of the present invention allow for CD consistency between a dummy gate and a subsequent RMG. In a typical embodiment, a dummy gate having a cap layer is formed over a substrate. A re-oxide layer is then formed over the substrate and around the dummy gate. A set of doping implants will then be implanted in the substrate, and the re-oxide layer will subsequently be removed (after the set of doping implants have been implanted). A set of spacers will then be formed along a set of side walls of the dummy gate and an epitaxial layer will be formed around the set of side walls. Thereafter, the dummy gate will be replaced with a metal gate (e.g., an aluminum or tungsten body having a high-k metal liner there-around).

20 Claims, 3 Drawing Sheets

PFET

| SubWafer # | %VT_E energy | %VT_dose dose | Idlin uA/um | Vtlin V | Ron ohm-um | Idsat uA/um | Vtlogs V | DIBL mV | Ieff uA/um | Isoff nA/um | Ioff nA/um | Ixoff nA/um | Cov fF/um |
|---|---|---|---|---|---|---|---|---|---|---|---|---|---|
| POR | 70 | 8.00E+12 | -83 | -0.563 | 421 | -361 | -0.448 | 115 | 143 | 0.309 | 1.702 | 1.393 | -0.438 |
| Invention | 65 | 4.00E+12 | -83 | -0.563 | 424 | -365 | -0.443 | 120 | 143 | 0.362 | 1.402 | 1.04 | -0.372 |

FIG. 3A

NFET

| SubWafer # | %haloE n.v | %haloT n.v | %LDD.E n.val | Vtlin V | Idlin uA/um | Ron ohm.um | Vtsat V | Idsat uA/um | DIBL mV | Ieff uA/um | Isoff nA/um | Idoff nA/um | Ixoff nA/um | Cov fF/um |
|---|---|---|---|---|---|---|---|---|---|---|---|---|---|---|
| POR | 25 | 22 | 2 | 0.696 | 78 | 297 | 0.532 | 336 | 70 | 122 | -0.098 | 8.167 | -8.069 | -0.39 |
| Invention | 24 | 21 | 2 | 0.691 | 79 | 296 | 0.521 | 349 | 70 | 127 | -0.153 | 5.584 | -5.431 | -0.325 |

FIG. 3B

SEMICONDUCTOR DEVICE HAVING CONTROLLED FINAL METAL CRITICAL DIMENSION

BACKGROUND OF THE INVENTION

1. Technical Field

Embodiments of the present invention relate to replacement metal gates (RMGs) for semiconductor devices. Specifically, embodiments of the present invention relate to providing critical dimension consistency between dummy gates and RMGs.

2. Related Art

In forming semiconductor devices, it is common to first form a dummy gate, apply various features/layers, and then replace the dummy gate with a metal gate knows as a replacement metal gate (RMG). One variable in such integration scheme is providing critical dimension consistency/stability between dummy gates and RMGs. Specifically, it is often the case that the dimensions of a dummy gate are greatly different than that of the final RMG. For example, due to integration specifics such as the introduction of spacers when forming a RMG, a RMG may have a significant greater width than its predecessor dummy gate. Such an anomaly may result in poor performance and diminished AC performance of the resulting device.

SUMMARY OF THE INVENTION

In general, aspects of the present invention relate to an approach for controlling a critical dimension (CD) of a RMG of a semiconductor device. Specifically, embodiments of the present invention allow for CD consistency between a dummy gate and a subsequent RMG. In a typical embodiment, a dummy gate having a cap layer is formed over a substrate. A re-oxide layer is then formed over the substrate and around the dummy gate. A set of doping implants will then be implanted in the substrate, and the re-oxide layer will subsequently be removed (after the set of doping implants have been implanted). A set of spacers will then be formed along a set of side walls of the dummy gate and an epitaxial layer will be formed around the set of side walls. Thereafter, the dummy gate will be replaced with a metal gate (e.g., an aluminum body having a high-k metal liner there-around).

A first aspect of the present invention provides a method for controlling a critical dimension (CD) of a gate of a semiconductor device, comprising: forming a dummy gate over a substrate; forming a re-oxide layer over the substrate and around the dummy gate; implanting a set of doping implants in the substrate; and removing the re-oxide layer after the set of doping implants have been implanted.

A second aspect of the present invention provides a method for controlling a critical dimension (CD) of a gate of a semiconductor device, comprising: forming a dummy gate over a substrate; forming a re-oxide layer over substrate and around the dummy gate; implanting a set of doping implants in the substrate; removing the re-oxide layer after the set of doping implants have been implanted; forming an epitaxial layer around the dummy gate; and replacing the dummy gate with a metal gate.

A third aspect of the present invention provides a method for controlling a critical dimension (CD) of a gate of a semiconductor device, comprising: forming a dummy gate having a cap layer over a substrate; forming a re-oxide layer over the substrate and around the dummy gate; implanting a set of doping implants in the substrate; removing the re-oxide layer after the set of doping implants have been implanted; forming a set of spacers along a set of side walls of the dummy gate; forming an epitaxial layer around the set of side walls; and replacing the dummy gate with a metal gate.

BRIEF DESCRIPTION OF THE DRAWINGS

These and other features of this invention will be more readily understood from the following detailed description of the various aspects of the invention taken in conjunction with the accompanying drawings in which:

FIG. 3A shows a simulation result based on a comparison of the integration scheme of FIG. 1 to the integration scheme of FIG. 2 for a PFET implant according to an embodiment of the present invention.

FIG. 3B shows a simulation result based on a comparison of the integration scheme of FIG. 1 to the integration scheme of FIG. 2 for a NFET implant according to an embodiment of the present invention.

Figure 1:
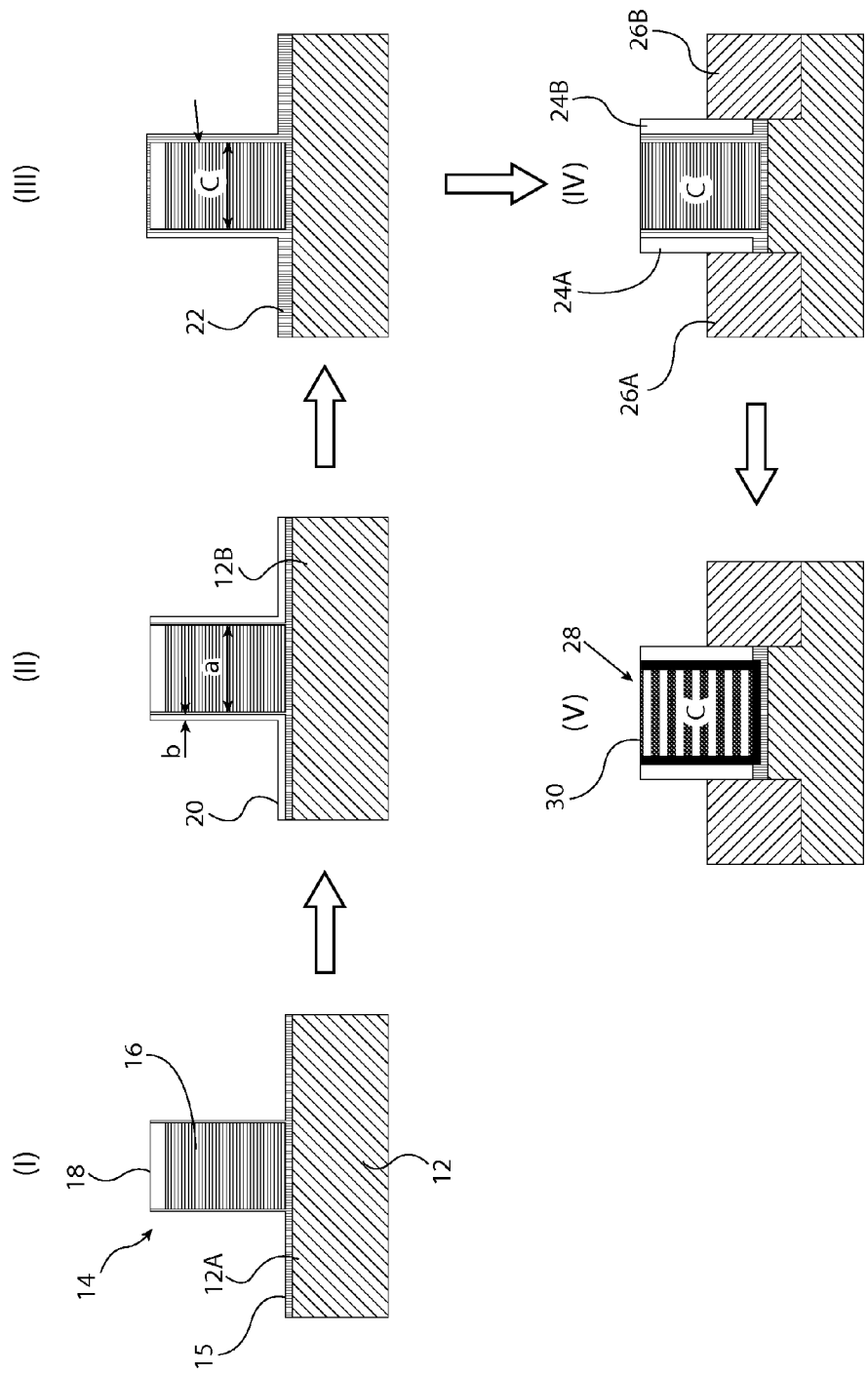
FIG. 1 shows a RMG integration scheme.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, in general, aspects of the present invention relate to an approach for controlling a critical dimension (CD) of a RMG of a semiconductor device. Specifically, embodiments of the present invention allow for CD consistency between a dummy gate and a subsequent RMG. In a typical embodiment, a dummy gate having a cap layer is formed over a substrate. A re-oxide layer is then formed over the substrate and around the dummy gate. A set of doping implants will then be implanted in the substrate, and the re-oxide layer will subsequently be removed (after the set of doping implants have been implanted). A set of spacers will then be formed along a set of side walls of the dummy gate and an epitaxial layer will be formed around the set of side walls. Thereafter, the dummy gate will be replaced with a metal gate (e.g., an aluminum or tungsten body having a high-k metal liner there-around).

Referring now to FIG. 1, an integration scheme (steps I-V) is shown for a semiconductor device according to a previous approach. As depicted in step I, an oxide layer 15 is formed over a substrate 12 [this number not on FIG. 1] (e.g., silicon (Si)) and a dummy gate 14 is formed over oxide layer 15. As further shown, dummy gate 14 comprises gate body 16 (having width "a") and gate cap 18 (e.g., silicon nitride (SiN)). In step II, a SiN layer 20 is formed over oxide layer 15 and along side walls of dummy gate 14 as spacers (each having width "b"). The resulting width ("c") of dummy gate 14 will be thus be as follows: c=a+2b. In steps I and step II, NFET 12A and PFET 12B implants are performed. Along these lines, NFET implant 12A is performed in step I (prior to formation of SIN layer 20), while PFET implant is performed after SiN layer 20 is formed in step II. Regardless, in step III, SiN layer 20 is oxidized to yield oxidized layer 22. In step IV, a set of spacers (e.g., SiN) will be formed around dummy gate 14, and an epitaxial layer 26A-B (e.g., e-silicon germanium (eSiGe), raised source drain (RSD), etc.) will be formed around set of spacers 24A-B. Then, in step V, dummy gate 14 will be replaced by metal gate 28 (e.g., replacement metal gate (RMG)). As shown, RMG 28 generally comprises a gate metal 30 and liner 32. In performing an integrations scheme such as that shown in FIG. 1, dimensional consistency is not maintained between dummy gate 14 and RMG 28. That is, RMG 28 is larger than dummy gate 14, resulting in increased $C_{ov}$, as well as reduced device performance.

Figure 2:
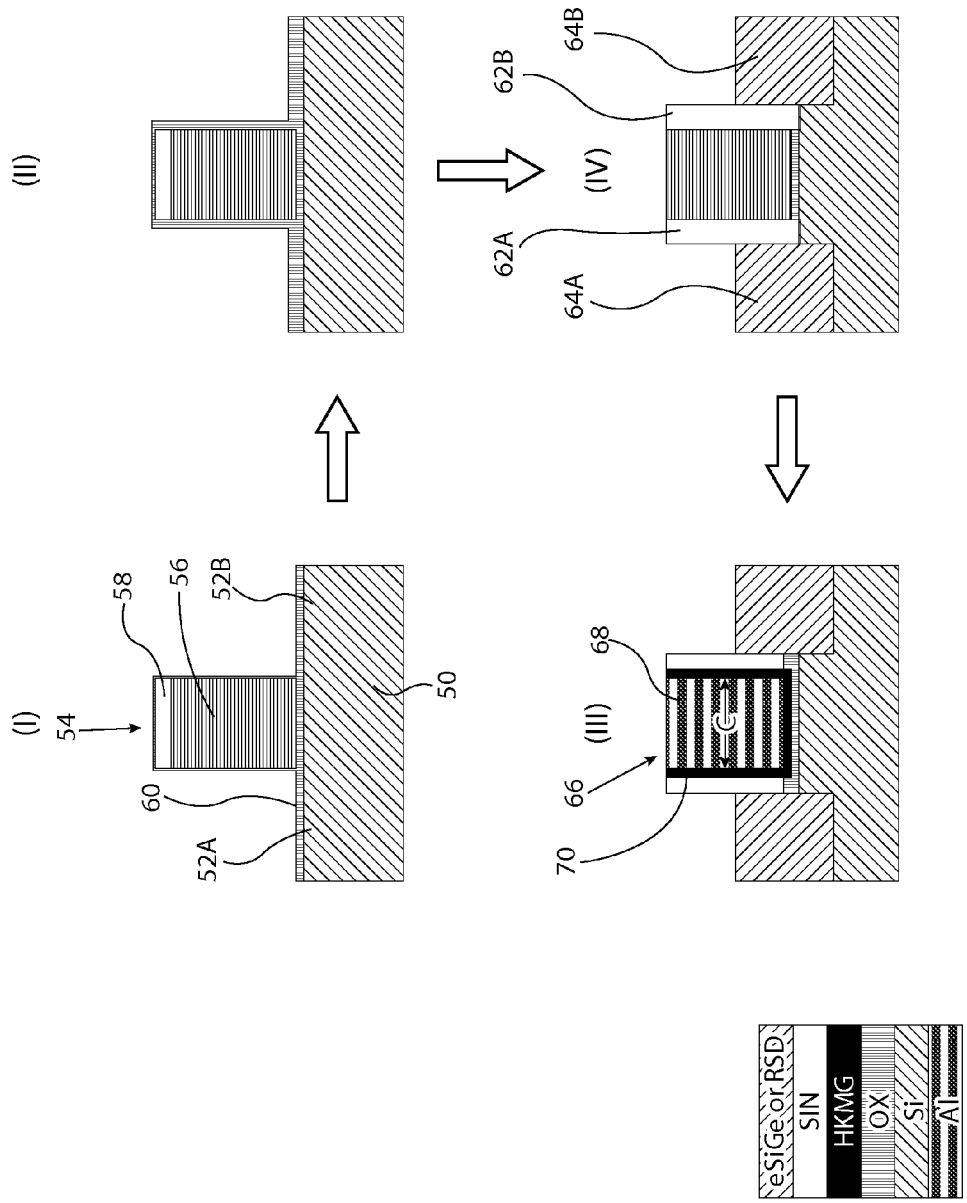
FIG. 2 shows a RMG integration scheme according to an embodiment of the present invention.

To address such dimensional inconsistencies, an integration scheme according to an approach of the present invention is shown in steps I-IV of FIG. 2. As depicted in step I, a substrate is provided over which a reactive oxide layer (re-oxide layer 60) and a dummy gate 54 (having gate body 56 and a gate cap 58 (e.g., SiN)) are formed. Unlike the integration scheme shown in FIG. 1, both NFET implant 52A and PFET implant 52B are formed in step I. Regardless, in step II, the re-oxide layer 60 is removed after implants 52A-B are formed. In step III, a set of spacers 62A-B (e.g., SiN) are formed around dummy gate 64, and an epitaxial layer 64A-B (e.g., eSiGe, RSD, etc.) is formed around set of spacers 62A-B. Then, in step IV, metal gate 66 (RMG) replaces dummy gate 64. As shown, RMG 66 generally comprises gate metal (e.g., Al) 68 and a high-k metal liner 70. This approach results in a RMG 66 whose dimensions/width is far more similar to that of dummy gate 54 than under the previous approaches.

Statistical evidence of the advantages of the approaches of the present invention is shown in FIGS. 3A-B. Specifically, graph 100 of FIG. 3A depicts a simulation result based on a comparison of the integration scheme of FIG. 1 (POR) to the integration scheme of FIG. 2 (Invention) for a PFET implant. As shown, the integration scheme of the present invention yields better $L_{eff}$ 102, $L_{off}$ 104, and $C_{ov}$ 106 than the previous integration schemes (POR). Similar results are yielded with respect to an NFET implant. Specifically, graph 110 of FIG. 3B depicts a simulation result 110 based on a comparison of the integration scheme of FIG. 1 (POR) to the integration scheme of FIG. 2 (Invention) for a PFET implant. As shown, the integration scheme of the present invention yields better $L_{eff}$ 112, $L_{off}$ 114, and $C_{ov}$ 116 than the previous integration schemes (POR).

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for controlling a critical dimension (CD) of a gate of a semiconductor device, comprising:
   forming a dummy gate over a substrate;
   forming a re-oxide layer over the substrate and around the dummy gate;
   implanting a set of doping implants in the substrate; and
   removing the re-oxide layer from atop the dummy gate and from a set of sidewalls of the dummy gate after the set of doping implants have been implanted.

2. The method of claim 1, further comprising:
   forming a set of spacers along the set of side walls of the dummy gate;
   forming an epitaxial layer around the set of spacers; and
   replacing the dummy gate with a metal gate.

3. The method of claim 2, further comprising replacing the dummy gate with a metal gate.

4. The method of claim 3, the metal gate comprising at least one of aluminum (Al) and tungsten (W).

5. The method of claim 4, the metal gate further comprising a high-k metal liner around the Al.

6. The method of claim 2, the set of spacers comprising silicon nitride.

7. The method of claim 2, the epitaxial layer comprising silicon germanium (SiGe).

8. The method of claim 1, the substrate comprising silicon.

9. The method of claim 1, the dummy gate having a silicon nitride cap.

10. A method for controlling a critical dimension (CD) of a gate of a semiconductor device, comprising:
    forming a dummy gate over a substrate;
    forming a re-oxide layer over the substrate and around the dummy gate;
    implanting a set of doping implants in the substrate;
    removing the re-oxide layer from atop the dummy gate and from a set of sidewalls of the dummy gate after the set of doping implants have been implanted;
    forming an epitaxial layer around the dummy gate; and
    replacing the dummy gate with a metal gate.

11. The method of claim 10, further comprising forming a set of spacers along the set of side walls of the dummy gate, the epitaxial layer being formed around the set of spacers.

12. The method of claim 11, the set of spacers comprising silicon nitride.

13. The method of claim 10, the metal gate comprising at least one of aluminum (Al) and tungsten (W).

14. The method of claim 13, the metal gate further comprising a high-k metal liner around the Al.

15. The method of claim 10, the epitaxial layer comprising silicon germanium (SiGe).

16. The method of claim 10, the substrate comprising silicon.

17. The method of claim 10, the dummy gate having a silicon nitride cap.

18. A method for controlling a critical dimension (CD) of a gate of a semiconductor device, comprising:
    forming a dummy gate having a cap layer over a substrate;
    forming a re-oxide layer over the substrate and around the dummy gate;
    implanting a set of doping implants in the substrate;
    removing the re-oxide layer from atop the dummy gate and from a set of sidewalls of the dummy gate after the set of doping implants have been implanted;
    forming a set of spacers along the set of side walls of the dummy gate;
    forming an epitaxial layer around the set of side walls; and
    replacing the dummy gate with a metal gate.

19. The method of claim 18, the metal gate comprising at least one of aluminum (Al) and tungsten (W).

20. The method of claim 19, the metal gate further comprising a high-k metal liner around the Al.

* * * * *